US009966218B2

(12) United States Patent
Nomaguchi et al.

(10) Patent No.: US 9,966,218 B2
(45) Date of Patent: May 8, 2018

(54) ELECTRON BEAM DEVICE

(71) Applicant: Hitachi High-Technologies Corporation, Minato-ku, Tokyo (JP)

(72) Inventors: Tsunenori Nomaguchi, Tokyo (JP); Toshihide Agemura, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days. days.

(21) Appl. No.: 15/303,282

(22) PCT Filed: Apr. 22, 2015

(86) PCT No.: PCT/JP2015/062178
§ 371 (c)(1),
(2) Date: Oct. 11, 2016

(87) PCT Pub. No.: WO2015/166849
PCT Pub. Date: Nov. 5, 2015

(65) Prior Publication Data
US 2017/0040139 A1 Feb. 9, 2017

(30) Foreign Application Priority Data
Apr. 28, 2014 (JP) ................................. 2014-092211

(51) Int. Cl.
*H01J 37/04* (2006.01)
*H01J 37/12* (2006.01)
(Continued)

(52) U.S. Cl.
CPC ............ *H01J 37/04* (2013.01); *H01J 37/065* (2013.01); *H01J 37/09* (2013.01); *H01J 37/12* (2013.01);
(Continued)

(58) Field of Classification Search
CPC .......... H01J 37/04; H01J 37/065; H01J 37/09; H01J 37/12; H01J 37/14; H01J 37/141;
(Continued)

(56) References Cited

U.S. PATENT DOCUMENTS 4,713,543 A * 12/1987 Feuerbaum ............. H01J 37/04
250/309
5,146,090 A * 9/1992 Plies ....................... H01J 37/12
250/311
(Continued)

FOREIGN PATENT DOCUMENTS

| CN | 1716512 A | 1/2006 |
|----|-----------|--------|
| JP | 5-36371 A | 2/1993 |

(Continued)

OTHER PUBLICATIONS

International Search Report (PCT/ISA/210) issued in PCT Application No. PCT/JP2015/062178 dated Jul. 7, 2015 with English translation (Four (4) pages).
(Continued)

*Primary Examiner* — David E Smith
(74) *Attorney, Agent, or Firm* — Crowell & Moring LLP (57) ABSTRACT

The present invention provides an electron beam device that achieves high spatial resolution and high luminance, while remaining insusceptible to the effects of external disturbance. The present invention relates to an electron beam device, wherein, between, e.g., an electron source for generating an electron beam and an objective lens for focusing the electron beam onto a sample, a high voltage beam tube is disposed close to the electron source and a low voltage beam tube is disposed close to the objective lens. This makes it possible to achieve high luminance while maintaining
(Continued)

spatial resolution, even with an SEM that is provided with a type of objective lens that actively leaks a magnetic field onto a sample.

20 Claims, 8 Drawing Sheets

(51) Int. Cl.
*H01J 37/141* (2006.01)
*H01J 37/145* (2006.01)
*H01J 37/28* (2006.01)
*H01J 37/065* (2006.01)
*H01J 37/14* (2006.01)
*H01J 37/244* (2006.01)
*H01J 37/09* (2006.01)

(52) U.S. Cl.
CPC .......... *H01J 37/14* (2013.01); *H01J 37/141* (2013.01); *H01J 37/145* (2013.01); *H01J 37/244* (2013.01); *H01J 37/28* (2013.01); *H01J 2237/04756* (2013.01); *H01J 2237/14* (2013.01)

(58) Field of Classification Search
CPC ........ H01J 37/145; H01J 37/244; H01J 37/28; H01J 2237/04756; H01J 2237/14
See application file for complete search history.

(56) References Cited

U.S. PATENT DOCUMENTS

| | | | |
|---|---|---|---|
| 6,107,633 A | 8/2000 | Frosien et al. | |
| 2003/0150991 A1* | 8/2003 | Kazumori | H01J 37/244 250/310 |
| 2005/0236568 A1* | 10/2005 | Buijsse | H01J 37/143 250/310 |
| 2006/0226360 A1* | 10/2006 | Frosien | H01J 37/05 250/310 |
| 2011/0068265 A1* | 3/2011 | Arai | H01J 3/027 250/306 |
| 2012/0043463 A1* | 2/2012 | Agemura | H01J 37/244 250/310 |
| 2012/0261573 A1* | 10/2012 | Adamec | H01J 37/244 250/307 |
| 2012/0286158 A1 | 11/2012 | Sohda et al. | |

FOREIGN PATENT DOCUMENTS

| | | |
|---|---|---|
| JP | 11-120950 A | 4/1999 |
| JP | 2004-234993 A | 8/2004 |
| JP | 2006-278329 A | 10/2006 |
| JP | 2010-257855 A | 11/2010 |
| WO | WO 2011/108368 A1 | 9/2011 |

OTHER PUBLICATIONS

Japanese-language Written Opinion (PCT/ISA/237) issued in PCT Application No. PCT/JP2015/062178 dated Jul. 7, 2015 (Three (3) pages).
Japanese-langauge Office Action issued in counterpart Japanese Application No. 2016-516331 dated Jun. 6, 2017 (six (6) pages).
Chinese-language Office Action issued in counterpart Chinese Application No. 201580019322.3 dated Feb. 2, 2018 (11 pages).

* cited by examiner

ELECTRON BEAM DEVICE

TECHNICAL FIELD

The present invention relates to an electron beam device including a magnetic field lens or an electrostatic lens or both lenses for focusing electrons onto a sample.

BACKGROUND ART

A scanning electron microscope (SEM) capable of performing nanometer-level observation is used in various fields such as a field of semiconductors, a field of materials and a field of biotechnology. The SEM is configured by including an electron source for generating electrons, and an electromagnetic lens for focusing generated electrons onto a sample, and the quality of a SEM image largely depends on performances of these components. For example, the quantity of electrons generated from the electron source, namely, the luminance of the electron source affects the SN (Signal-to-Noise) ratio of the SEM image, and the performance of the electromagnetic lens affects spatial resolution of the SEM image to be obtained.

Patent Literature 1 discloses a technique in which high-energy electrons are emitted from the electron source, and the speed of the high-energy electrons is reduced between an objective lens and a sample, thereby increasing the luminance of the electron source and suppressing the effects from the outside.

Patent literature 2 discloses a technique in which the speed of high energy electrons is reduced on an undersurface of an objective lens, thereby realizing high spatial resolution even when low-energy electrons are emitted to a sample.

Patent Literature 3 discloses an arrangement of a device for accelerating electrons from a first energy to a higher second energy within a range of an intermediate image so as to obtain high point resolution even when beam energy is low.

CITATION LIST

Patent Literature

Patent Literature 1: JP-A 2004-234993
Patent Literature 2: JP-A 5-36371
Patent Literature 3: JP-A 2010-257855

SUMMARY OF INVENTION

Technical Problem

The inventors of the present invention have obtained the following knowledge as a result of earnest examination of SEM performance.

In Patent Literature 1, it is necessary to apply a voltage to the sample, accordingly, the SEM performance largely depends on the shape and composition of the sample. On the other hand, it is possible to obtain high spatial resolution while keeping the same potential between the objective lens and the sample in Patent Literature 2. Therefore, when Patent Literature 1 is combined with Patent Literature 2, high luminance and high spatial resolution can be realized regardless of the sample. However, the effect is limited to an out-lens type SEM which does not leak a magnetic field to the sample's side. This is because the out-lens is assumed to be used in Patent Literature 2. In a semi-in-lens type SEM or a single-pole lens type SEM which may actively leak the magnetic field onto the sample, spatial resolution is deteriorated when the speed of electrons is decelerated on an undersurface of the objective lens.

An object of the present invention is to suppress the effects of external disturbance while high spatial resolution and high luminance are both realized.

Solution to Problem

The present invention relates to, for example, an arrangement of a high voltage beam tube close to an electron source and a low voltage beam tube close to an objective lens between the electron source generating an electron beam and an objective lens for focusing the electron beam on a sample.

Advantageous Effects of Invention

According to the present invention, even in the SEM having an objective lens belonging to a type that actively leaks a magnetic field onto a sample, high luminance can be achieved while keeping spatial resolution.

DESCRIPTION OF EMBODIMENTS

In examples, there is disclosed an electron beam device including an electron source for generating an electron beam, and an objective lens for focusing the electron beam onto a sample, which includes a first beam tube capable of setting a voltage close to the electron source, and a second beam tube capable of setting a voltage different from the first beam tube close to the objective lens between the electron source and an undersurface of the objective lens and an input device capable of selecting a mode in which the voltage of the first beam tube becomes higher than the voltage of the second beam tube.

Also in the embodiment, there is disclosed that the input device can select a mode in which the voltage of the first beam tube becomes the same as the voltage of the second beam tube.

Also in the embodiment, there is disclosed that the objective lens is a semi-in-lens type lens or a single-pole lens type lens which leaks a magnetic field onto the sample's side. There is also disclosed that an out-lens type objective lens which does not leak the magnetic field onto the sample's side is provided in addition to the semi-in-lens type or the single-pole lens type objective lens. There is also disclosed that the mode in which voltage is applied only to the first beam tube is selected when the semi-in-lens type or the single-pole lens type objective lens is used, and the mode in which voltage is applied to the first and the second beam tubes is selected when the out-lens type objective lens is used. Furthermore, there is disclosed that the mode in which a potential of the first beam tube become the same potential as a potential of the second beam tube is selected when the out-lens type objective lens is used. There is also disclosed that the electron beam device includes an ion beam device irradiating the sample with an ion beam.

Also in the example, there is disclosed that the second beam tube is arranged inside the objective lens.

Also in the example, there is disclosed that a potential of the second beam tube is a GND potential.

Also in the example, there is disclosed that a creepage distance between the first beam tube and the second beam tube is 5 mm or more.

Also in the example, there is disclosed an electron beam device including an electron source for generating an electron beam, a deceleration part for decelerating electrons generated from the electron source and an objective lens for focusing the electron beam onto a sample, in which the deceleration part is disposed between the electron source and a magnetic pole of the objective lens.

Also, in the example, there is disclosed that a shape of electrodes in the deceleration part is a cone shape, a bowl shape or a frustum shape.

Also in the example, there is disclosed that the deceleration part includes two electrodes, having a shape in which one electrode covers the other electrode.

Also in the example, there is disclosed an electron beam device having an electron source for generating an electron beam, a condenser lens for focusing the electron beam generated from the electron source, and an objective lens for focusing the electron beam passing through the condenser lens onto a sample, which includes a first beam tube and a second beam tube in which energy of the electron beam generated when passing through the condenser lens is higher than energy of the electron beam generated when passing through the objective lens.

Also in the embodiment there is disclosed an electron beam device having an electron source for generating an electron beam, and an objective lens for focusing the electron beam generated from the electron source onto a sample, which includes a detector having a beam tube through which the electron beam generated from the electron source passes, and an electron receiving surface through which the beam tube penetrates, detecting electrons emitted from a sample and a first beam tube and a second beam tube in which energy generated when the electron beam generated from the electron source passes through the beam tube is higher than energy of the electron beam generated when passing through the objective lens.

Also in the embodiment, there is disclosed an electron beam device including an electron source for generating an electron beam, a beam tube through which the electron beam generated from the electron source passes, an objective lens for focusing the electron beam generated from the electron source onto a sample, a detector for detecting electrons emitted from the sample and arranged in the outside of an optical axis and a deflector for deflecting the electrons emitted from the sample toward the detector arranged in the outside of the optical axis, in which a first beam tube and a second beam tube are provided, in which energy generated when the electron beam generated from the electron source passes through the beam tube is higher than energy of the electron beam generated when passing through the deflector and the objective lens.

Hereinafter, the above and other novel characteristics and advantages of the present invention will be explained with reference to the drawings. The drawings are used for understanding the invention and do not limit the scope of rights.

Example 1

Figure 1:
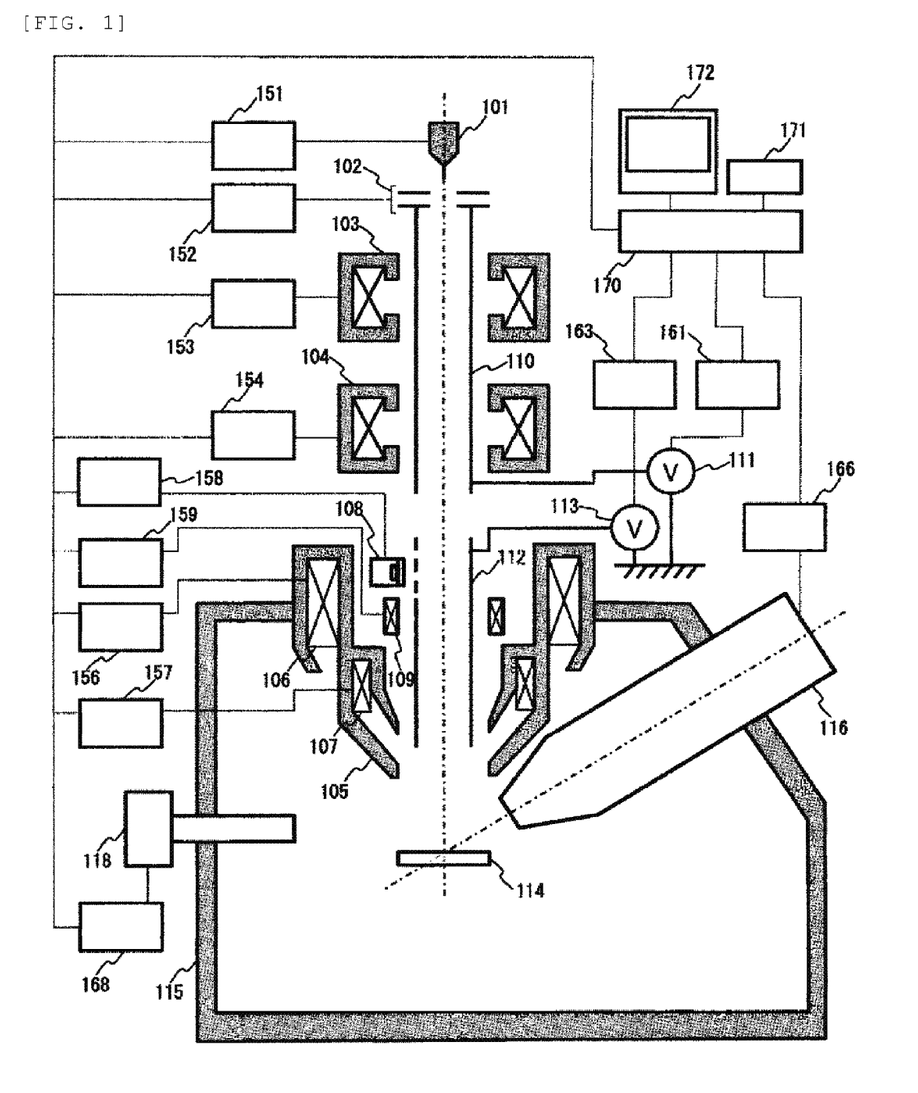
FIG. 1 is a schematic configuration view of a compound charged particle beam device according to Example 1.

FIG. 1 shows a schematic configuration of a compound charged particle beam device including an electron beam device and an ion beam device according to the embodiment. The compound charged particle beam device includes an electron source 101 generating an electron beam, an electron source controller 151 controlling the electron source, an accelerating electrode 102 accelerating the electron beam emitted from the electron source, an accelerating electrode controller 152 controlling the accelerating electrode, first and second condenser lenses 103, 104 focusing the electron beam emitted from the electron source, first and second condenser lens controllers 153, 154 controlling the first and second condenser lenses, a magnetic path 105 of an objective lens focusing the electron bean onto a sample, a semi-in-lens coil 106 driving a semi-in-lens type objective lens, a semi-in-lens controller 156 controlling the semi-in-lens coil, an out-lens coil 107 driving an out-lens type objective lens, an out-lens controller 157 controlling an out-lens, a sample chamber detector 118 detecting electrons emitted from the sample in the outside of a column, a sample chamber detector controller 168 controlling the sample chamber detector, an in-column detector 108 detecting the electrons emitted from the sample inside the column, an in-column detector controller 158 controlling the in-column detector, a deflector 109 deflecting the electrons emitted from the sample to direction of the in-column detector, a deflector controller 159 controlling the deflector, a first beam tube 110 arranged from the acceleration electrode to the vicinity of the second condenser lens, a power source for the first beam tube 111 supplying voltage to the first beam tube, a power source controller for the first beam tube 161 controlling the power source for the first beam tube, second beam tube 112 arranged from an upper end of the magnetic path forming the objective lens to the vicinity of a lower end of the objective lens, a power source for the second beam tube 113 supplying voltage to the second beam tube, a second beam tube controller 163 controlling the power source for the second beam tube, a sample chamber 115 in which an observation sample 114 is placed, an ion beam column 116 irradiating the sample with an ion beam, an ion beam column controller 166 controlling the ion beam column, an integrative computer 170 controlling operations of the entire device and constructing an electron beam image, a controller (a keyboard, a mouse or the like) 171 for inputting various instructions such as irradiation conditions, voltage conditions and position conditions of electrodes by the operator and a display 172 displaying the acquired images and a control screen. The electron beam device further includes all components necessary for the electron beam device such as a deflection system for scanning and shifting the electron beam. The respective controllers and operation units can be communicated with one another, which are controlled by the integrative computer 170.

In the example, the controller 171 can select a given mode from some modes. The integrative computer 170 allows states of the first beam tube 110, the second beam tube 112 and so on to be given states and makes the device in the given mode in accordance with an input from the controller 171.

Two condenser lenses are included in the example, however, the number of condenser lenses does not matter for the purpose of controlling electrons incident on the objective lens. Moreover, the shape of the magnetic path 105 does not manner as long as the semi-in-lens type objective lens is a type of a lens which actively leaks the magnetic field to the sample's side. For example, a single pole lens having only one magnetic pole may be used. Although a lower end of the accelerating electrode contacts the first beam tube in FIG. 1, it is not necessary that the lower end of the accelerating electrode contacts the first beam tube and it is not necessary that they have the same potential either.

Figure 2:
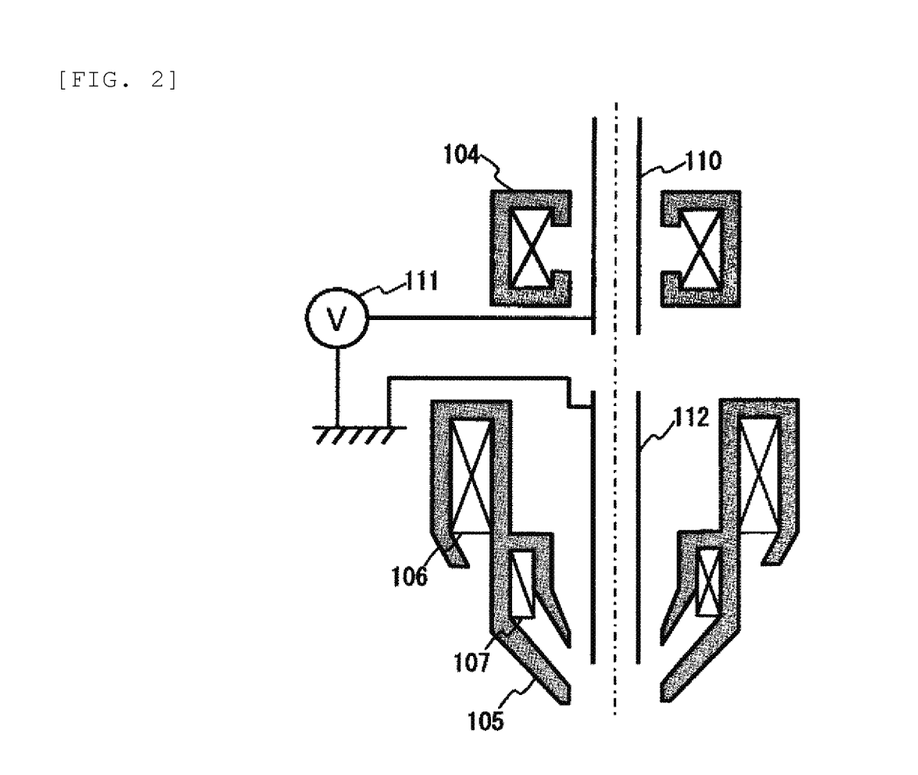
FIG. 2 is a view showing a wiring example 1 of a beam tube part.
Figure 3:
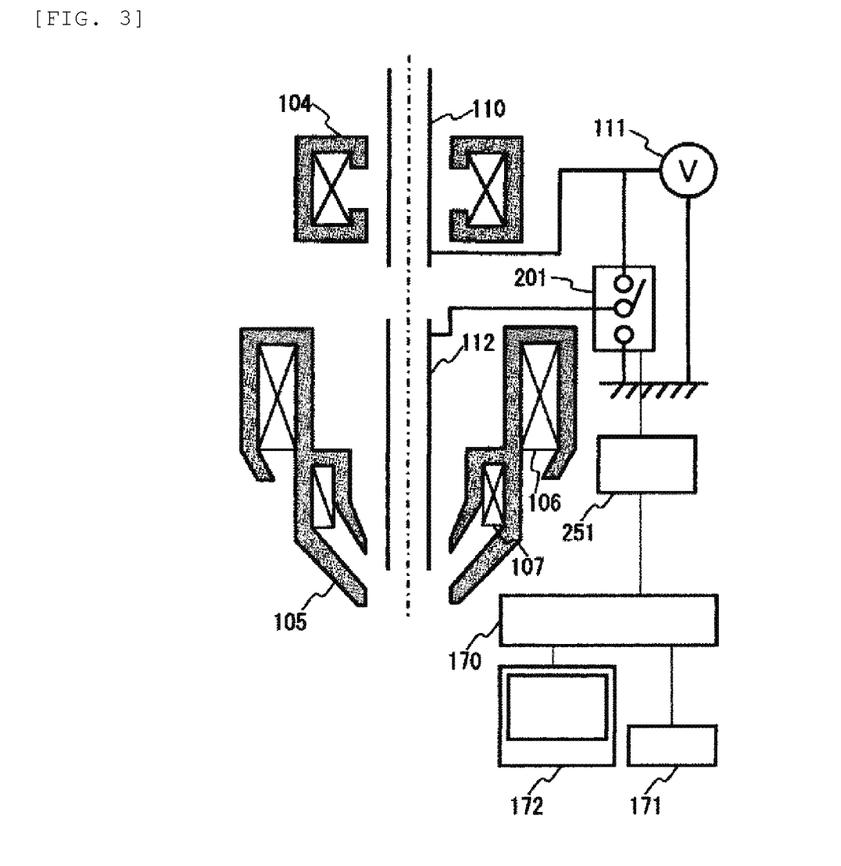
FIG. 3 is a view showing a wiring example 2 of the beam tube part.
Figure 10:
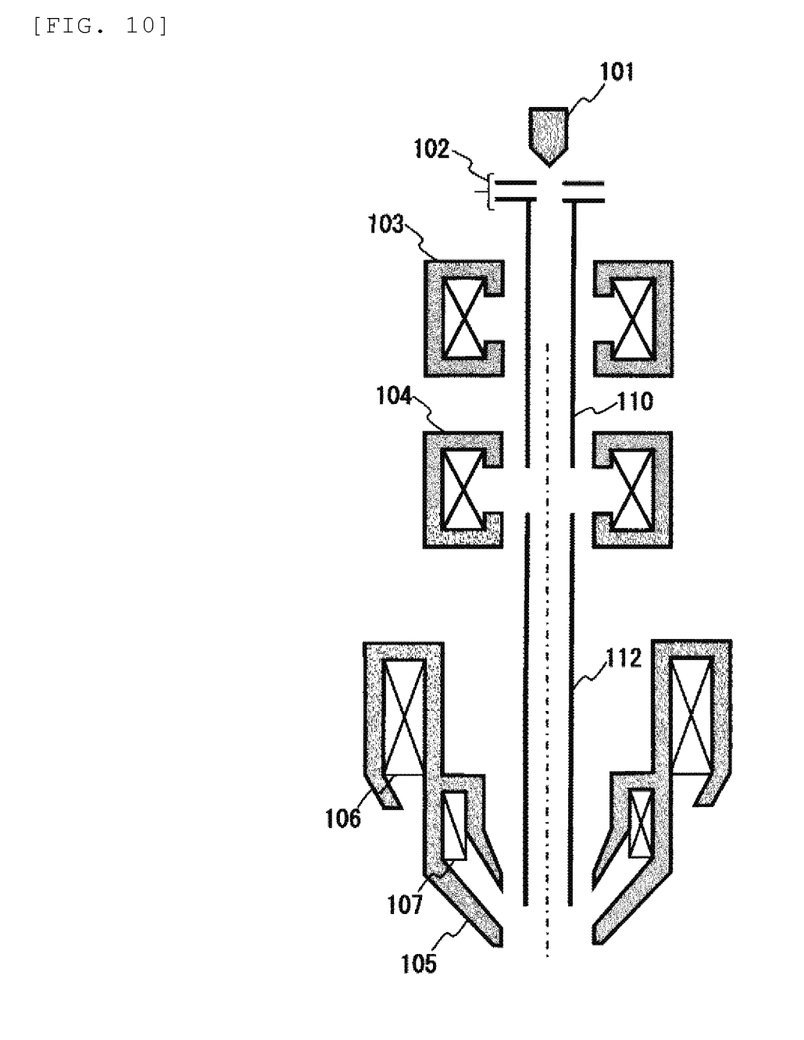
FIG. 10 is a view showing a dividing example 1 of a beam tube.
Figure 11:
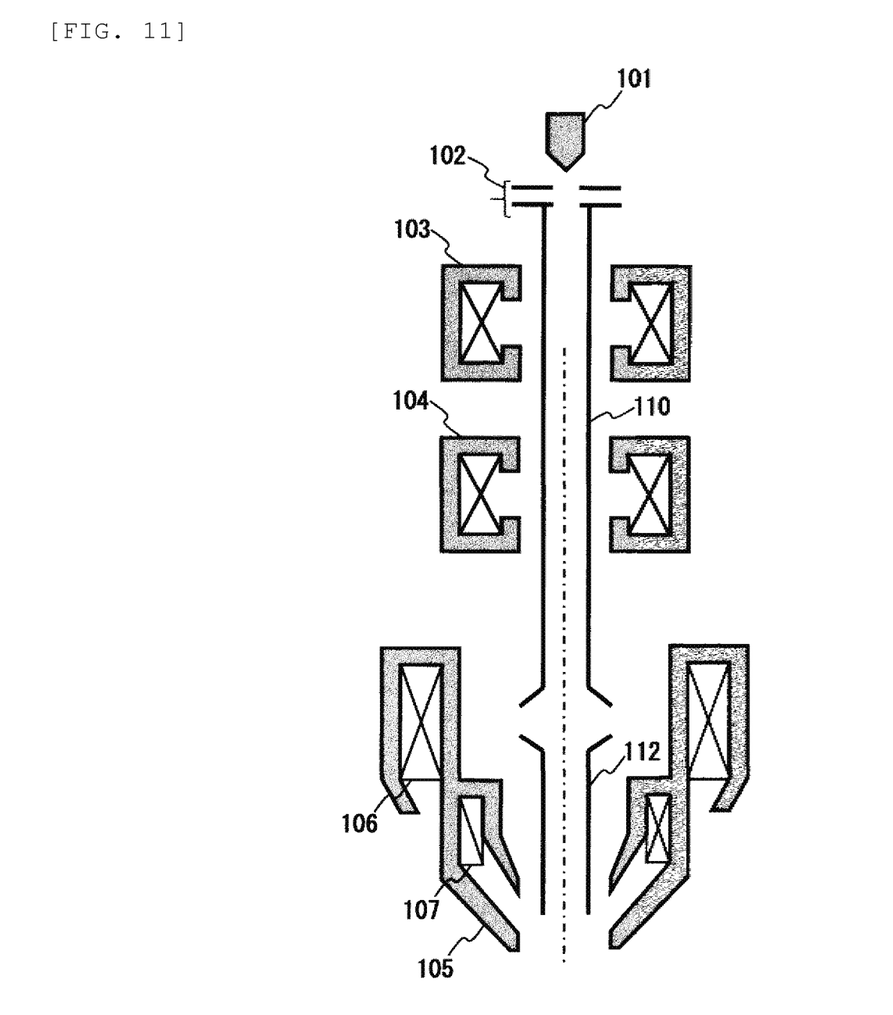
FIG. 11 is a view showing a dividing example 2 of the beam tube.

The power source for the first beam tube and the power source for the second beam tube are provided in the example, however, a case where the power source for the second beam tube is not provided can be considered. For example, a potential of the second beam tube may be constantly a GND potential by connecting the second beam tube to the GND as shown in FIG. 2. Furthermore, it is also possible that the potential of the second beam tube can be switched between a potential of the first beam tube and the GND potential by providing a voltage changeover switch 201 and a switch controller 251 controlling the voltage changeover switch as shown in FIG. 3. The first beam tube and the second beam tube are divided between the second condenser lens and the magnetic path 105 of the objective lens in the example, however, the dividing position of the first beam tube and the second beam tube may be, for example, a position closer to the electron gun than an undersurface of the second condenser lens as shown in FIG. 10 as well as may be a position inside the magnetic path of the objective lens as shown in FIG. 11.

The configuration of the in-column detector 108 does not matter for the purpose of detecting electrons emitted from the sample. A configuration of directly counting electrons can be adopted, and a configuration in which electrons are converted into light once to be detected by a photodetector can be adopted.

In the example, even when the semi-in-lens type objective lens is used, the effects of external disturbance can be suppressed as well as high luminance can be obtained. That is, high spatial resolution and high luminance are both achieved. The lower the energy of the electron beam applied to the sample is, the more easily the device is affected by external disturbance, and the more difficult it is to obtain high luminance and high spatial resolution. However, it is further required to reduce energy of the electron beam in accordance with the needs of acquiring sample outmost surface information due to high integration of semiconductor and the needs of reducing damage due to electron beam irradiation in biological samples and organic functional materials. Accordingly, the first beam tube is set to a high voltage and the second beam tube is set to a low voltage (or GND potential), thereby achieving high resistance to external disturbance, high luminance and high spatial resolution to meet these needs.

Furthermore, in the case of a compound objective lens including the semi-in-lens type objective lens and the out-lens type objective lens, the control process can be simplified and usability can be improved. In the case of the out-lens type, it is highly likely that high spatial resolution is realized when the electron beam passes with high energy to the vicinity of the lower end of the objective lens. That is, high luminance and high spatial resolution can be achieved by setting both of the first and second beam tubes in the example to the high voltage. On the other hand, in the case of the semi-in-lens type, the first beam tube is set to a high voltage and the second beam tube is set to a low voltage (or GND potential), thereby realizing higher spatial resolution than in the case of being driven by the out-lens type in addition to obtaining the luminance of the same degree as in the case of being driven by the out-lens type. The electron beam with the same high energy passes in places closer to the electron source than the objective lens in cases of being driven by any type of lens, therefore, the same control is performed in components other than the objective lens. Accordingly, re-adjustment of an optical axis and so on are not necessary, which is advantageous from a viewpoint of operationality. Such compound objective lens is extremely effective in a FIB-SEM device including a FIB column emitting a focused ion beam (FIB) and the SEM in the same sample chamber. When the magnetic field exists on the optical axis of an ion beam, the ion beam is deflected due to the magnetic field. Moreover, the deflection amount by the magnetic field differs according to the mass of ions, therefore, the ion beam including an isotope does not focus to one point on the sample, and is separated. Accordingly, when both the ion beam and the electron beam are used, the out-lens type objective lens is preferably used rather than the semi-in-lens type objective lens. However, there is a case where high spatial resolution of the semi-in-lens type is required even at the expense of throughput in some of samples. In such case, the ion beam radiation and the electron beam radiation using the semi-in-type lens are used by being switched. In that case, the burden of the user can be reduced when only the mode of the objective lens can be switched to be used as in the example. It is further convenient that switching can be performed with one-touch operation by using the controller or a GUI screen.

Figure 4:
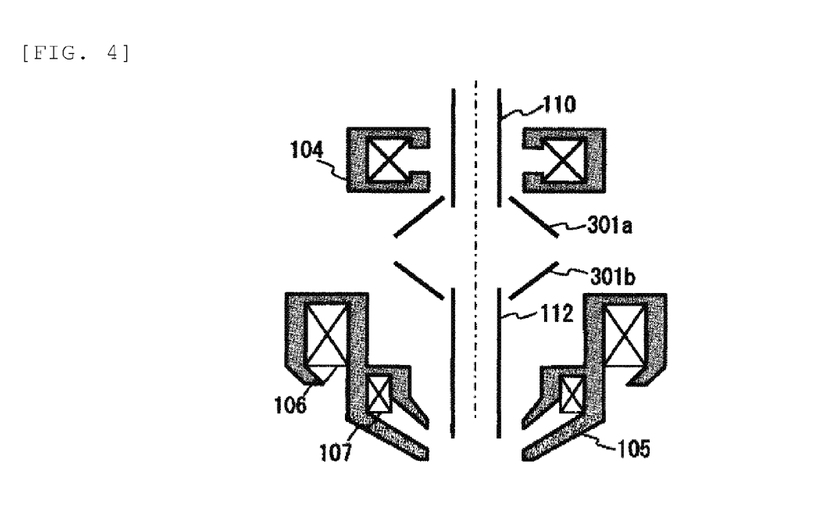
FIG. 4 is a view showing a configuration example 1 in a deceleration part.

As a deceleration part between the first beam tube and the second beam tube, as shown in FIG. 1, a deceleration electric field formed by a gap part between the first beam tube and the second beam tube may be used as it is, however, it is also preferable that a cone-shaped deceleration part electrode 301*a* opening to the objective lens is provided at the lower end of the first beam tube, and a cone-shaped deceleration part electrode 301*b* opening to the electron source is provided at the upper end of the second beam tube to configure the deceleration part as shown in FIG. 4. Accordingly, electrostatic lens action formed in the deceleration part can be alleviated. The deceleration part may be formed by providing only one of the deceleration part electrode 301*a* and the deceleration part electrode 301*b*.

Figure 5:
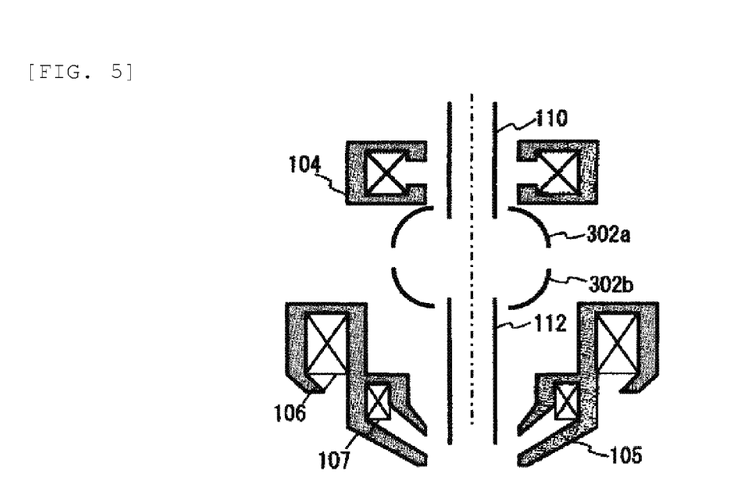
FIG. 5 is a view showing a configuration example 2 in the deceleration part.

Similarly, it is also preferable that a bowl-shaped deceleration part electrode 302*a* opening to the objective lens is provided at the lower end of the first beam tube, and a bowl-shaped deceleration part electrode 302*b* opening to the electron source is provided at the upper end of the second beam tube to configure the deceleration part as shown in FIG. 5. The deceleration part may be formed by providing only one of the deceleration part electrode 302*a* and the deceleration part electrode 302*b*.

Figure 6:
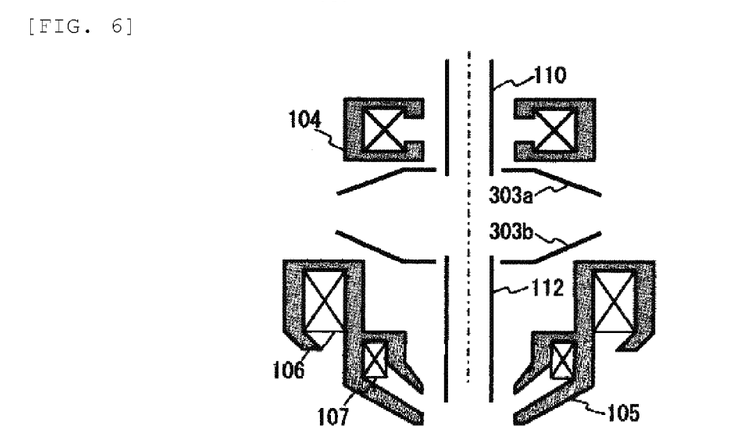
FIG. 6 is a view showing a configuration example 3 in the deceleration part.
Figure 7:
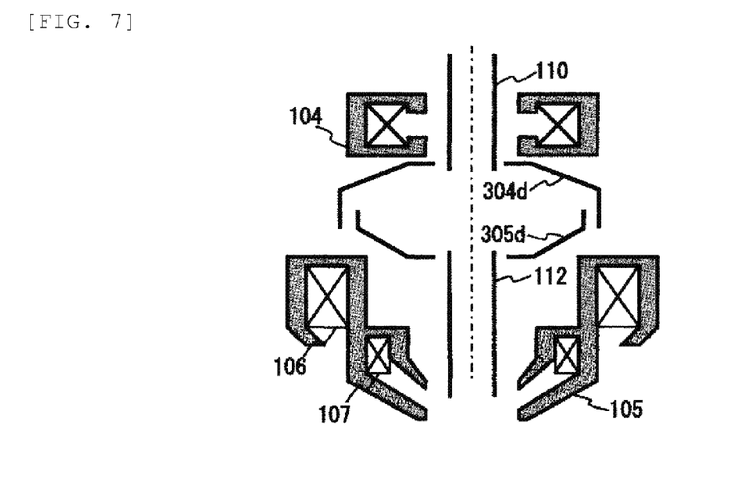
FIG. 7 is a view showing a configuration example 4 in the deceleration part.

Similarly, it is also preferable that a frustum shaped deceleration part electrode 303*a* opening to the objective lens is provided at the lower end of the first beam tube, and a frustum shaped deceleration part electrode 303*b* opening to the electron source is provided at the upper end of the second beam tube to configure the deceleration part as shown in FIG. 6.

Though the upper and lower electrodes of the deceleration part have the same size in FIG. 4 to FIG. 6, the present invention is not limited to this. For example, it is also preferable to have a shape in which an approximately frustum shaped deceleration electrode part 304d opening to the objective lens an end portion of which has a cylindrical shape is provided at the lower end of the first beam tube, an approximately frustum shaped deceleration electrode part 305d an end portion of which has a cylindrical shape is provided at the upper end of the second beam tube and the cylindrical shape of the deceleration electrode part 304d is formed to be larger than the cylindrical shape of the deceleration electrode part 305d so that the deceleration electrode part 304d provided close to the first beam tube covers the deceleration electrode part 305d provided close to the second beam tube. Accordingly, the effects of the outside of the deceleration part electrodes can be reduced.

Figure 8:
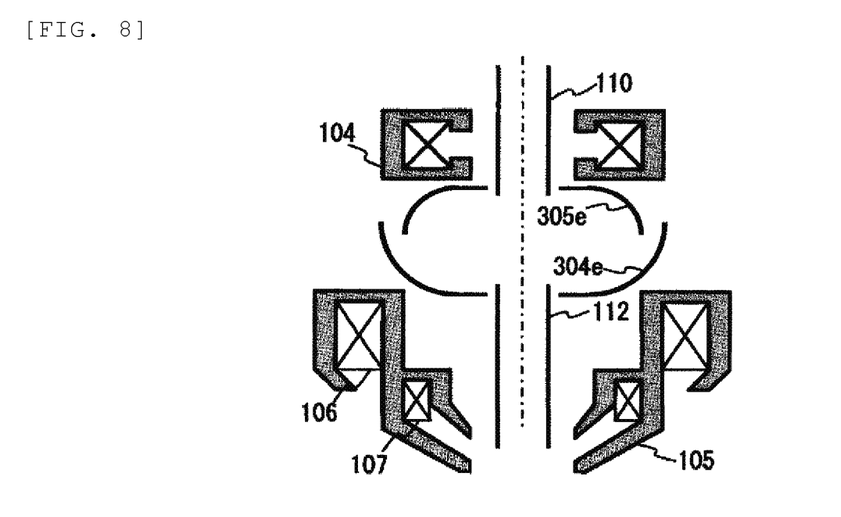
FIG. 8 is a view showing a configuration example 5 in the deceleration part.

Similarly, as shown in FIG. 8, it is also preferable to have a shape in which a bowl-shaped deceleration part electrode 305e opening to the objective lens is provided at the lower end of the first beam tube, a bowl-shaped deceleration part 304e opening to the electron source is provided at the upper end of the second beam tube, and an opening of the deceleration part electrode 305e is formed to be smaller than an opening of the deceleration part electrode 304e so that the deceleration electrode part 304e provided close to the first beam tube covers the deceleration electrode part 305e provided close to the second beam tube.0.

Next, a mounting position of the in-column detector will be explained. In the case where the semi-in-lens type objective lens is used, almost all the electrons emitted from the sample enter the inside of the SEM column. Therefore, it is necessary to detect electrons inside the SEM column. As a method thereof, a method of detecting electrons at a place apart from the optical axis of the electron beam as in the example can be considered. The method of detecting the electrons at the place apart from the optical axis has an advantage that electrons emitted vertically upward (toward the tip end of the electron source) from the sample. As the electrons emitted vertically upward from the sample are selectively detected, an image on which composition information of the sample is strongly reflected can be acquired. However, in order to detect electrons at the place apart from the optical axis, it is necessary to deflect the electrons. In that case, the required deflection strength is determined by the energy of electrons. Therefore, it is easier to design the deflector so that the electrons are deflected when passing through the second beam in which the electrons have lower energy, not through the first beam tube to which high voltage is applied.

Example 2

Figure 9:
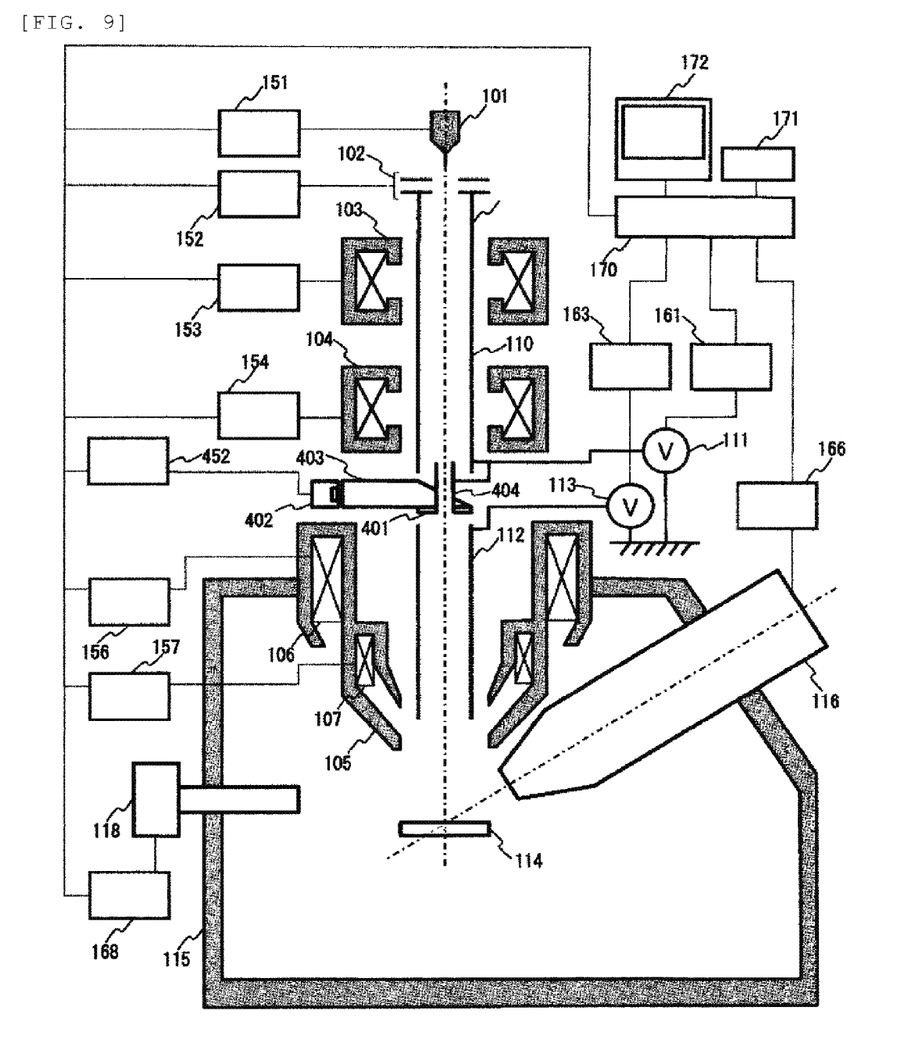
FIG. 9 is a schematic configuration view of a compound charged particle beam device according to Example 2.

FIG. 9 shows a basic configuration of a compound charged particle beam device according to the embodiment. The example differs from Example 1 in a point that a configuration of the in-column detector for detecting electrons emitted from the sample in the column and a mounting position thereof are different from Example 1. Hereinafter, explanation will be made by focusing on different points from Example 1.

The detector according to the example includes a scintillator 401 converting electrons into light, a photodetector 402 detecting light emitted from the scintillator, a photodetector controller 452 controlling the photodetector, a light guide 403 guiding light emitted from the scintillator to the photodetector and a third beam tube 404 penetrating the scintillator and the light guide, which is mounted between the first beam tube and the second beam tube. The third beam tube and the scintillator have the same potential as the first beam tube.

According to the embodiment, high external disturbance resistance, high luminance and high spatial resolution can be realized also in the semi-in-lens type objective lens in the same manner as Example 1. Furthermore, the potentials of the third beam tube and the scintillator as components of the in-column detector are the same as the first beam tube to which high voltage is applied regardless of the mode of the objective lens (the semi-in-lens type and the out-lens type), therefore, the example has an advantage that it is not necessary to change the setting of the detector even when the mode of the objective lens is switched. Accordingly, the user can switch between the semi-in-lens type and the out-lens type more seamlessly. Additionally, as the potential of the scintillator and the potential of the first beam tube are the same, there is an advantage that it is not necessary to prepare a new power source and a new voltage introducing path for applying voltage to the scintillator.

REFERENCE SIGNS LIST 101 electron source
102 accelerating electrode
103 first condenser lens
104 second condenser lens
105 magnetic path
106 semi-in-lens coil
107 out-lens coil
108 in-column detector
109 deflector
110 first beam tube
111 power source for first beam tube
112 second beam tube
113 power source for second beam tube
114 observation sample
115 sample chamber
116 ion beam column
118 sample chamber detector
151 electron source controller
152 accelerating electrode controller
153 first condenser lens controller
154 second condenser lens controller
156 semi-in-lens coil controller
157 out-lens coil controller
158 in-column detector controller
159 deflector controller
161 power source controller for first beam tube
163 power source controller for second beam tube
166 ion beam column controller
168 sample chamber detector controller
170 integrative computer
171 controller (keyboard, mouse and so on)
172 display
201 voltage changeover switch
251 switch controller
301a, 301b, 302a, 302b, 303a, 303b, 304c, 304c, 305d, 305e deceleration part electrode
401 scintillator
402 photodetector
403 light guide
404 third beam tube
452 photodetector controller

The invention claimed is:

1. An electron beam device including
an electron source for generating an electron beam, and
an objective lens for focusing the electron beam onto a sample, the device comprising:
a first beam tube capable of setting a voltage close to the electron source, and a second beam tube capable of setting a voltage different from the first beam tube close to the objective lens between the electron source and an undersurface of the objective lens,
wherein the objective lens is a semi-in-lens type lens or a single-pole lens type lens,
an out-lens type objective lens is provided in addition to the semi-in-lens type or the single-pole lens type objective lens, and
the mode in which the voltage of the first beam tube becomes higher than the voltage of the second beam tube is selected when the semi-in-lens type or the single-pole lens type objective lens is used.

2. The electron beam device according to claim 1,
wherein the input device can select a mode in which the voltage of the first beam tube becomes the same as the voltage of the second beam tube when the out-lens type objective lens is used.

3. The electron beam device according to claim 1,
wherein the mode in which voltage is applied only to the first beam tube is selected when the semi-in-lens type or the single-pole lens type objective lens is used, and
the mode in which voltage is applied to the first and the second beam tubes is selected when the out-lens type objective type is used.

4. The electron beam device according to claim 3,
wherein the mode in which a potential of the first beam tube becomes the same potential as a potential of the second beam tube is selected when the out-lens type objective lens is used.

5. The electron beam device according to claim 1, further comprising:
an ion beam device irradiating the sample with an ion beam.

6. The electron beam device according to claim 1,
wherein the second beam tube is arranged inside the objective lens.

7. The electron beam device according to claim 1,
wherein a potential of the second beam tube is a GND potential.

8. The electron beam device according to claim 1,
wherein a creepage distance between the first beam tube and the second beam tube is 5 mm or more.

9. An electron beam device comprising:
an electron source for generating an electron beam;
a first beam tube and a second beam tube through which the electron beam generated from the electron source passes;
a deceleration part for decelerating electrons generated from the electron source; and
an objective lens for focusing the electron beam onto a sample,
wherein the deceleration part is disposed between the electron source and a magnetic pole of the objective lens, and
the deceleration part is disposed between the first beam tube and second beam tube.

10. The electron beam device according to claim 9,
wherein a shape of electrodes in the deceleration part is a cone shape, a bowl shape or a frustum shape.

11. The electron beam device according to claim 9,
wherein the deceleration part includes two electrodes, having a shape in which one electrode covers the other electrode.

12. An electron beam device including
an electron source for generating an electron beam,
a condenser lens for focusing the electron beam generated from the electron source,
an objective lens for focusing the electron beam passing through the condenser lens onto a sample,
a first beam tube arranged between the electron source and the objective lens, and a second beam tube arranged between the first beam tube and the sample,
wherein the objective lens is a semi-in-lens type lens or a single-pole lens type lens,
an out-lens type objective lens is provided in addition to the semi-in-lens type or the single-pole lens type objective lens, and
the mode in which the voltage of the first beam tube becomes higher than the voltage of the second beam tube is selected when the semi-in-lens type or the single-pole lens type objective lens is used.

13. An electron beam device including
an electron source for generating an electron beam, and
an objective lens for focusing the electron beam generated from the electron source onto a sample, the device comprising:
a detector having a third beam tube through which the electron beam generated from the electron source passes, and an electron receiving surface through which the third beam tube penetrates, detecting electrons emitted from a sample; and
a first beam tube and a second beam tube in which energy generated when the electron beam generated from the electron source passes through the third beam tube is higher than energy of the electron beam generated when passing through the objective lens.

14. The electron beam device according to claim 13,
wherein the objective lens is a semi-in-lens type lens or a single-pole lens type lens which leaks a magnetic field onto the sample's side.

15. The electron beam device according to claim 14,
wherein an out-lens type objective lens which does not leak the magnetic field onto the sample's side is provided in addition to the semi-in-lens type or the single-pole lens type objective lens.

16. The electron beam device according to claim 14, further comprising:
an ion beam device irradiating the sample with an ion beam.

17. An electron beam device comprising:
an electron source for generating an electron beam;
a first beam tube and a second beam tube through which the electron beam generated from the electron source passes;
an objective lens for focusing the electron beam generated from the electron source onto a sample;
a detector for detecting electrons emitted from the sample and arranged in the outside of an optical axis; and
a deflector for deflecting the electrons emitted from the sample toward the detector arranged in the outside of the optical axis,
wherein the first beam tube is arranged between the electron source and the detector, and the second beam tube is arranged between the detector and an undersurface of the objective lens, and energy generated when the electron beam generated from the electron source passes through the first beam tube is higher than energy of the electron beam generated when passing through the second beam tube.

18. The electron beam device according to claim 17, wherein the objective lens is a semi-in-lens type lens or a single-pole lens type lens which leaks a magnetic field onto the sample's side.

19. The electron beam device according to claim 18, wherein an out-lens type objective lens which does not leak the magnetic field onto the sample's side is provided in addition to the semi-in-lens type or the single-pole lens type objective lens.

20. The electron beam device according to claim 18, further comprising:
an ion beam device irradiating the sample with an ion beam.

\* \* \* \* \*